United States Patent
Conolly et al.

(10) Patent No.: US 11,058,161 B2
(45) Date of Patent: Jul. 13, 2021

(54) HEAT REFLECTING COMPOSITES WITH KNITTED INSULATION

(71) Applicant: XEFCO PTY LTD, Lilyfield (AU)

(72) Inventors: Brian John Conolly, Northwood (AU); Thomas Kenneth Hussey, Balmain (AU)

(73) Assignee: XEFCO PTY LTD, Eveleigh (AU)

(*) Notice: Subject to any disclaimer, the term of this patent is extended or adjusted under 35 U.S.C. 154(b) by 1294 days.

(21) Appl. No.: 13/768,912

(22) Filed: Feb. 15, 2013

(65) Prior Publication Data
US 2013/0212789 A1 Aug. 22, 2013

(30) Foreign Application Priority Data
Feb. 16, 2012 (AU) ................ 2012900560

(51) Int. Cl.
*A41D 31/06* (2019.01)
*B32B 5/02* (2006.01)
(Continued)

(52) U.S. Cl.
CPC .............. *A41D 31/065* (2019.02); *B32B 5/02* (2013.01); *B32B 5/022* (2013.01); *B32B 5/024* (2013.01); *B32B 5/026* (2013.01); *B32B 27/12* (2013.01); *B32B 27/285* (2013.01); *B32B 27/34* (2013.01); *B32B 27/40* (2013.01); *B32B 37/14* (2013.01); *C23C 14/34* (2013.01); *B32B 2255/02* (2013.01); *B32B 2255/205* (2013.01); *B32B 2255/28* (2013.01); *B32B 2307/304* (2013.01); *B32B 2307/3065* (2013.01); (Continued)

(58) Field of Classification Search
CPC ....... B32B 27/285; B32B 27/34; B32B 27/40; B32B 5/02; B32B 5/022; B32B 5/024; B32B 5/026; A41D 31/0038; F03G 3/06; F03G 7/10; Y10S 74/09; Y10T 428/249921; Y10T 442/3382; Y10T 442/475; Y10T 442/654
USPC ........... 156/272.6; 427/160; 2/458; 428/221; 442/228, 316, 76, 77, 86, 286, 376
See application file for complete search history.

(56) References Cited

U.S. PATENT DOCUMENTS

| | | |
|---|---|---|
| 3,707,433 A | 12/1972 | Clough et al. |
| 4,136,222 A | 1/1979 | Jonnes |

(Continued)

FOREIGN PATENT DOCUMENTS

| | | |
|---|---|---|
| DE | 10343308 A1 | 4/2005 |
| GB | 2411621 A | 9/2005 |

(Continued)

OTHER PUBLICATIONS

"Thermal Conductivity of Materials and Gases." Engineeringtoolbox.com. N.p. Web. Apr. 19, 2016. <http://www.engineeringtoolbox.com/>.

(Continued)

*Primary Examiner* — Arti Singh-Pandey
(74) *Attorney, Agent, or Firm* — Nixon & Vanderhye P.C.

(57) ABSTRACT

Fabrics made for apparel, tents, sleeping bags and the like, in various composites, constructed such that there is at least one metal layer, forming a radiant barrier to reduce heat loss via radiation from the human body, and insulating this metal layer from heat loss via conduction, and a process for its manufacture.

17 Claims, 2 Drawing Sheets

(51) Int. Cl.
*B32B 27/12* (2006.01)
*B32B 27/40* (2006.01)
*B32B 27/34* (2006.01)
*B32B 27/28* (2006.01)
*B32B 37/14* (2006.01)
*C23C 14/34* (2006.01)

(52) U.S. Cl.
CPC . *B32B 2307/416* (2013.01); *B32B 2307/7145* (2013.01); *B32B 2307/724* (2013.01); *B32B 2307/73* (2013.01); *B32B 2437/00* (2013.01); *Y10T 428/249921* (2015.04); *Y10T 442/3382* (2015.04); *Y10T 442/475* (2015.04); *Y10T 442/654* (2015.04)

(56) References Cited

U.S. PATENT DOCUMENTS

| | | |
|---|---|---|
| 4,525,406 A | 6/1985 | Pollock |
| 4,685,155 A | 8/1987 | Fingerhut et al. |
| 4,739,012 A | 4/1988 | Hagman |
| 4,842,893 A | 6/1989 | Yializis et al. |
| 4,868,062 A | 9/1989 | Hoeschele et al. |
| 4,954,371 A | 9/1990 | Yializis |
| 5,032,461 A | 7/1991 | Shaw et al. |
| 5,238,618 A * | 8/1993 | Kinzer ............ A61F 13/00008 264/154 |
| 5,547,508 A | 8/1996 | Affinito |
| 5,955,175 A | 9/1999 | Culler |
| 5,958,115 A | 9/1999 | Bottcher et al. |
| 5,978,133 A | 11/1999 | Gillich |
| 6,066,826 A | 5/2000 | Yializis |
| 6,083,628 A | 7/2000 | Yializis |
| 6,112,328 A | 9/2000 | Spector |
| 6,270,841 B1 | 8/2001 | Mikhael et al. |
| 6,358,570 B1 | 3/2002 | Athnito |
| 6,468,595 B1 | 10/2002 | Mikhael et al. |
| 6,599,850 B1 | 7/2003 | Heifetz |
| 6,800,573 B2 | 10/2004 | Van De Ven et al. |
| 6,824,819 B2 | 11/2004 | Vogt et al. |
| 7,013,496 B2 | 3/2006 | Dunn |
| 7,157,117 B2 | 1/2007 | Mikhael et al. |
| 7,805,907 B2 | 10/2010 | Bletsos et al. |
| 2004/0213918 A1 | 10/2004 | Mikhael et al. |
| 2006/0024228 A1 | 2/2006 | Liang et al. |
| 2006/0040091 A1 | 2/2006 | Bletsos et al. |
| 2006/0099431 A1 | 5/2006 | Scholz |
| 2006/0265814 A1 | 11/2006 | Ritter |
| 2007/0037465 A1 | 2/2007 | Nutz et al. |
| 2007/0166528 A1 | 7/2007 | Barnes et al. |
| 2010/0247855 A1* | 9/2010 | Bletsos ............ B32B 5/22 428/137 |
| 2010/0282433 A1 | 11/2010 | Blackford |
| 2011/0262699 A1 | 10/2011 | Yializis et al. |
| 2012/0288662 A1* | 11/2012 | Conolly ............ A43B 1/0045 428/87 |
| 2015/0305421 A1* | 10/2015 | Conolly ............ B32B 5/02 156/272.6 |

FOREIGN PATENT DOCUMENTS

| | | |
|---|---|---|
| GB | 2448469 A | 10/2008 |
| WO | 9818852 A1 | 5/1998 |
| WO | 9958757 A1 | 11/1999 |
| WO | 9959185 A1 | 11/1999 |
| WO | 2005005698 A1 | 1/2005 |
| WO | 2009126979 A1 | 10/2009 |
| WO | WO-2011063472 A1 * | 6/2011 ........ A43B 1/0045 |
| WO | 2012073095 A1 | 6/2012 |
| WO | 2013030658 A1 | 3/2013 |

OTHER PUBLICATIONS

Senic et al., Application of TiO2 Nanoparticles for Obtaining Self-Decontaminating Smart Textiles, Jan. 2011, Science Technical Review, vol. 61, No. 3-4, pp. 63-72. (Year: 2011).

* cited by examiner

HEAT REFLECTING COMPOSITES WITH KNITTED INSULATION

FIELD OF THE INVENTION

The present invention relates to fabrics made for apparel, tents, sleeping bags and the like, in various composites, constructed such that there is at least one metal layer, forming a radiant barrier to reduce heat loss via radiation from the human body, and insulating this metal layer from heat loss via conduction, and a process for its manufacture.

BACKGROUND OF THE INVENTION

In the present invention the use of metallization to create infrared reflecting barriers is adopted for clothing or outdoor equipment such as sleeping bags or tents. Corrosion, particularly in salty environments, of these metal layers through oxidisation can be considerable and methods known in the art are adopted to help prevent oxidisation. These radiant barriers, however, also require careful insulation from heat loss via conduction, and moisture management to help keep emissivity low.

When a moisture vapor permeable substrate is coated over substantially an entire surface using conventional methods such as air knife coating, flexographic printing, gravure coating, etc., the coating reduces the moisture vapor permeability of the substrate. If the starting substrate has an open structure and is highly air permeable, the substrate can retain sufficient moisture vapor permeability after coating to be useful in certain end uses, such as apparel. For example, fabrics described in U.S. Pat. No. 5,955,175 to Culler are both air permeable and moisture vapor permeable after being metalized and coated with an oleophobic coating.

When the starting moisture vapor permeable substrate is a non-porous monolithic membrane, conventional coatings result in significant covering of the surface of the substrate. This results in a coated substrate having significantly lower moisture vapor permeability than the starting substrate. This is undesirable in apparel or outdoor equipment products, which are desirably permeable to moisture vapor while at the same time forming a barrier to infiltration by air and water. As described by Sympatex in U.S. Pat. No. 6,800,573 it is possible to coat these non-porous vapour permeable substrates using a plasma cleaned vapour deposition metalization process and maintain good vapour permeability.

US Patent Application Publication US 2004/0213918 A1 (Mikhael et al.) discloses a process for functionalizing a porous substrate, such as a nonwoven fabric or paper, with a layer of polymer, and optionally a layer of metal or ceramic. According to one embodiment, the process includes the steps of flash evaporating a monomer having a desired functionality in a vacuum chamber to produce a vapor, condensing the vapor on the porous substrate to produce a film of the monomer on the porous substrate, curing the film to produce a functionalized polymeric layer on the porous substrate, vacuum depositing an inorganic layer over the polymer layer, and flash evaporating and condensing a second film of monomer on the inorganic layer and curing the second film to produce a second polymeric layer on the inorganic layer. Mikhael et al. also discloses another embodiment including the steps of flash evaporating and condensing a first film of monomer on the porous substrate to produce a first film of the monomer on the porous substrate, curing the film to produce a functionalized polymeric layer on the porous substrate, vacuum depositing a metal layer over the polymer layer, and flash evaporating and condensing a second film of monomer on the metal layer and curing the second film to produce a second polymeric layer on the metal layer.

US Patent Applications US 2007/0166528 A1 (Barnes et al.) discloses a process for oxidising the surface of a metal coating with an oxygen-containing plasma to form a synthetic metal oxide coating, making a superior resistance to corrosion of the metallized porous sheet. These sheets, however, are micro-porous and less durable than can be constructed by non-porous monolithic membranes.

It would be desirable to provide metallized fabrics that have good protection against oxidation while not sacrificing high moisture vapor permeability for uses requiring good thermal barrier properties such as clothing, sleeping bags and tents.

Methods for both improving the moisture vapour permeability of the composite and insulating the metal layer from conduction are disclosed in PCT application PCT/IB2011/002872 (Conolly et al.). Conolly achieved this by covering the substrate first with a textile prior to metallization, where this textile is then preferably a very open pore structure, such that the metallization coats through the air gaps of the textile onto the substrate layer. Methods for managing the infra red emissivity of the metal layer are also disclosed by Conolly, achieved by protecting the metal layer from moisture, where the textile is preferably high wicking/hydrophilic and the metal layer is coated for water and/or oil repellent functionality.

The current invention discloses a further method for both improving the moisture vapour permeability of the composite and insulating the metal layer from conduction. By selecting a textile spacer fabric, that is highly open in structure for infra red transparency, while still maintaining mechanical stability, providing an insulating air space from conduction.

The concept of a textile spacer fabric is not new, commercial developer Matthew Townshend of Leicester took out an initial patent for spacer fabrics in 1868. The patent was for knitting mattresses on a two needle bed hand frame with interconnecting threads. Spacer fabrics are essentially two layers of fabric separated by yarns at a 90 degree angle. Typically today these fabrics are created by 3D warp knitting, however it is also possible to build spacer fabric with weft knitting machines. The innovation disclosed here is its use with a radiant barrier and the methods required to optimize the effectiveness of the radiant barrier, by minimizing contact between the radiant barrier and the textile spacer fabric, maximizing infra red transparency and minimizing thermal conduction.

SUMMARY OF THE INVENTION

Fabrics are made for apparel, in various composites, and are constructed such that there is at least one metal layer, forming a radiant barrier for heat loss via radiation from the human body.

According to a first embodiment of the present invention the metal layer is combined with a textile layer to insulate the metal layer from heat loss via conduction, while maintaining low emissivity and optimising the infrared reflectance. This textile layer is optimised for infra red transparency, preferably a knitted spacer fabric with a porous pattern, and mechanical separation to promote an air gap insulation for heat conduction.

In a preferred embodiment of the present invention, the knitted layer is a 3D warp knit fabric with good air gaps to expose the low emissivity surface of the metal layer. The 3D warp knitted fabric also has a predetermined thickness to provide insulation between the metal layer and other surfaces. In a preferred embodiment, the metal layer is a metallized moisture vapour permeable membrane, whereby the surface of the said membrane is suitable to maintain a low emissivity when metalized.

In a preferred embodiment of the present invention, additional moisture build up on the metal layer is reduced, thus helping maintain low emissivity, via hydrophilic and/or hydrophobic functionalization of layers within the composite.

The preferred manufacturing technique for layering and building the composite fabric is via plasma treatment, vacuum vapour deposition, including flash evaporation of the metallic, organic and inorganic components to a substrate whereby said substrate is combined with the said textile fabric by means of lamination, by using an adhesive, or a melt film, or a melt fibre between surfaces or a stitching/needling process.

In one embodiment, the metal layer can have increased corrosion resistance by oxidising the surface of a metal coating with an oxygen-containing plasma to form a self protective metal oxide coating.

Functionalization of the various coatings can also be optionally included, and alternative embodiments of the present invention may also have extra material layers in the composite. Any layer may be coated for functionalization, preferably during the same plasma treated vacuum vapour deposition process, and preferably via vapour deposition utilising flash evaporation, to be flame retardant, UV absorbing, self cleaning, hydrophobic, hydrophilic, or antibacterial.

DETAILED DESCRIPTION OF THE INVENTION

As used herein, the term "metal" includes metal alloys as well as metals.

In one embodiment, the present invention relates to an infra-red reflective, moisture vapor permeable composite formed by coating at least one side of a moisture vapor permeable substrate 203 with at least one metal layer 204 and coating this said metal layer with at least one textile layer 202. This textile layer 202 has a pattern with an open structure such that a high percentage of the metal layer 204 is still exposed through the air gaps of the textile, thus maintaining good infrared reflectance. The said textile layer 202 can be chosen to be hydrophilic, so as to wick moisture off the metal surface between the air gaps of the textile layer 202. Preferably, a thin organic or inorganic coating layer is also deposited on the surface of the metal coating layer 204 preferably with a hydrophobic functionalization to further protect it from oxidisation and moisture build up thereby maintaining the low emissivity of the surface. The substrate 203 can also optionally have an outer organic or inorganic coating, to provide other functionalization useful in the application, such as oliophobic, hydrophobic, UV absorbing, antibacterial polymerisation and the like. The coatings are preferably formed under vacuum using vapor deposition techniques under conditions that substantially coat the substrate without significantly reducing its moisture vapor permeability.

Figure 2A:
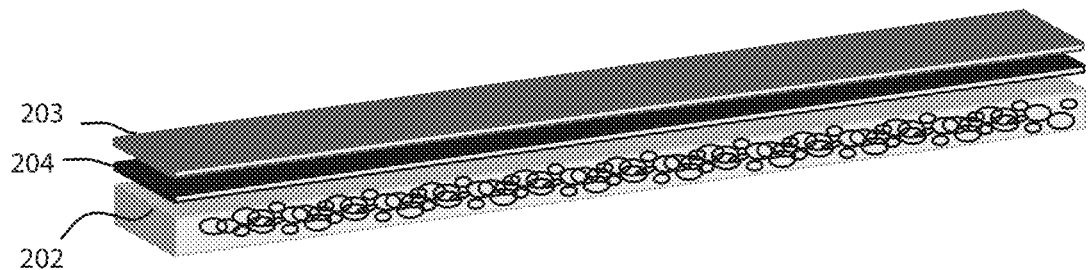
FIGS. 2a, 2b, 2c and 2d are schematic diagrams showing various layering combinations of base fabrics, membranes, textile insulating layers, metallization.

In one embodiment, as shown in FIG. 2a, the textile layer 202 can be laminated to the metalized 204 substrate 203 after metallization.

Figure 2B:
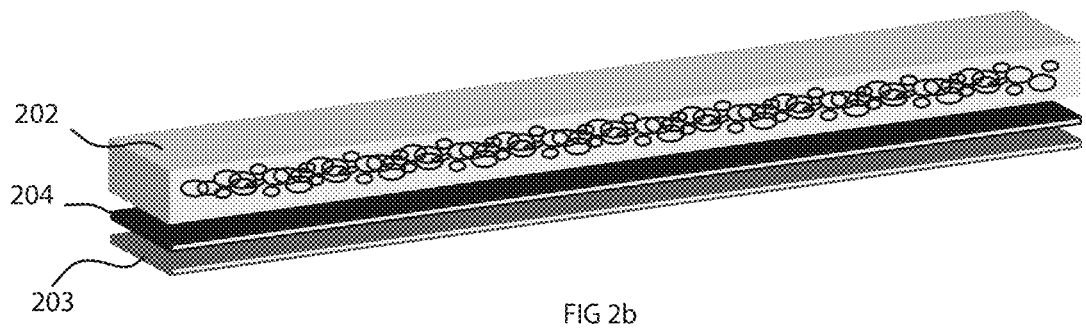

In a preferred embodiment, as shown in FIG. 2a, the fabric may be configured in a way that the low emissivity surface of the metal layer faces towards the inside of the said garment or other item. In an alternative embodiment as shown in FIG. 2b, the said low emissivity surface of the metal layer may face toward the outside of the said garment or other item.

Figure 2C:
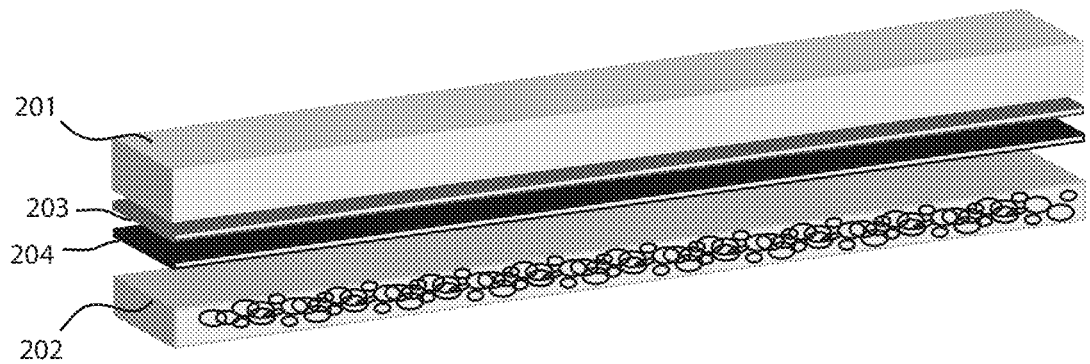
Figure 2D:
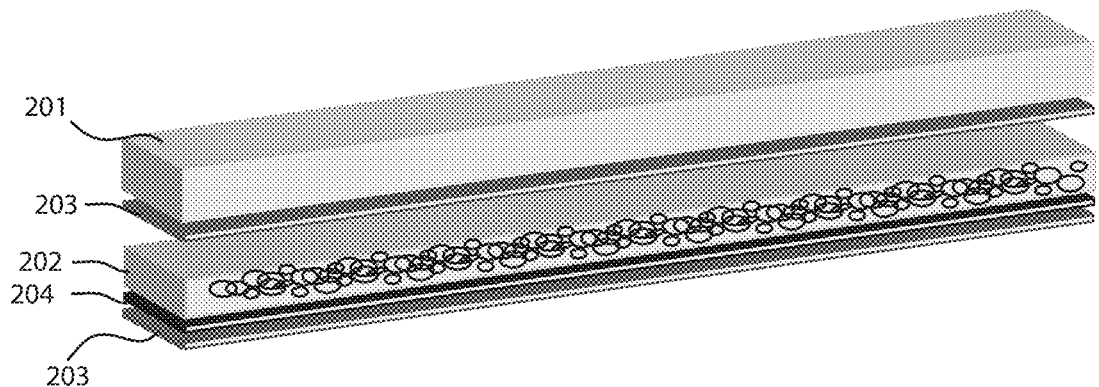

In FIGS. 2c and 2d, an optional textile 201 is bonded to the substrate 203. This textile can be a knitted, woven or nonwoven textile, with optional functionalization depending on the application. In a preferred embodiment, the textile layer 201 protects the substrate 203 from the environment, and is a shell fabric, with or without stretch, and optionally with antibacterial and hydrophobic or oliophobic functionalization.

In a preferred embodiment of the present invention, the said substrate is coated with the following layers to produce a metalized low emissivity surface: Substrate/L1/M, Substrate/L1/M/L2, and Substrate/L1/M/L2/M/L3, etc. where Substrate is a moisture vapor permeable substrate layer, M is a low emissivity metal layer and L1, L2, and L3 are organic coating layers comprising an organic polymer or organic oligomer, or blends thereof. The abbreviation "L1" is used herein to refer to an intermediate organic coating layer that is deposited on a surface of the substrate layer prior to depositing a metal layer thereon. The composite substrates optionally include at least one outer organic coating layer overlying the metal layer such as L2 and L3 in the above-described structures. In composite substrate structures having more than one metal layer, individual metal layers can be formed from the same or different metal and can have the same or different thickness. Similarly, in structures having more than one organic coating layer, the individual organic coating layers can have the same or different composition and/or thickness. Each metal layer can comprise more than one adjacent metal layers wherein the adjacent metal layers can be the same or different. Similarly, each organic layer can comprise more than one adjacent organic layer, wherein the adjacent organic layers can be the same or different. The substrate layer can be coated on one side, as in the structures described above, or on both sides such as in the following structures: L2/M/Substrate/M/L2, L2/M/L1/Substrate/L1/M/L2.

In one embodiment of the present invention, at least one textile spacer layer is applied to the substrate, either prior or after coating with said organic and metal layers, where said textile spacer layer consists of a yarn that has relatively low thermal conductivity as compared to metal, and the said textile spacer layer is combined with the substrate by process of lamination, by using an adhesive, or a melt film, or a melt fibre between surfaces or a stitching/needling process.

In a preferred embodiment of the present invention, the textile spacer layer (K) is applied to the substrate surface adjacent to the organic and metal layers to form the following composites: Substrate/L1/M/K, Substrate/L1/M/L2/K, Substrate/M/L2/K, etc. where said textile spacer layer K is a material of low thermal heat conductivity and is combined with the substrate by process of lamination.

Figure 1A:
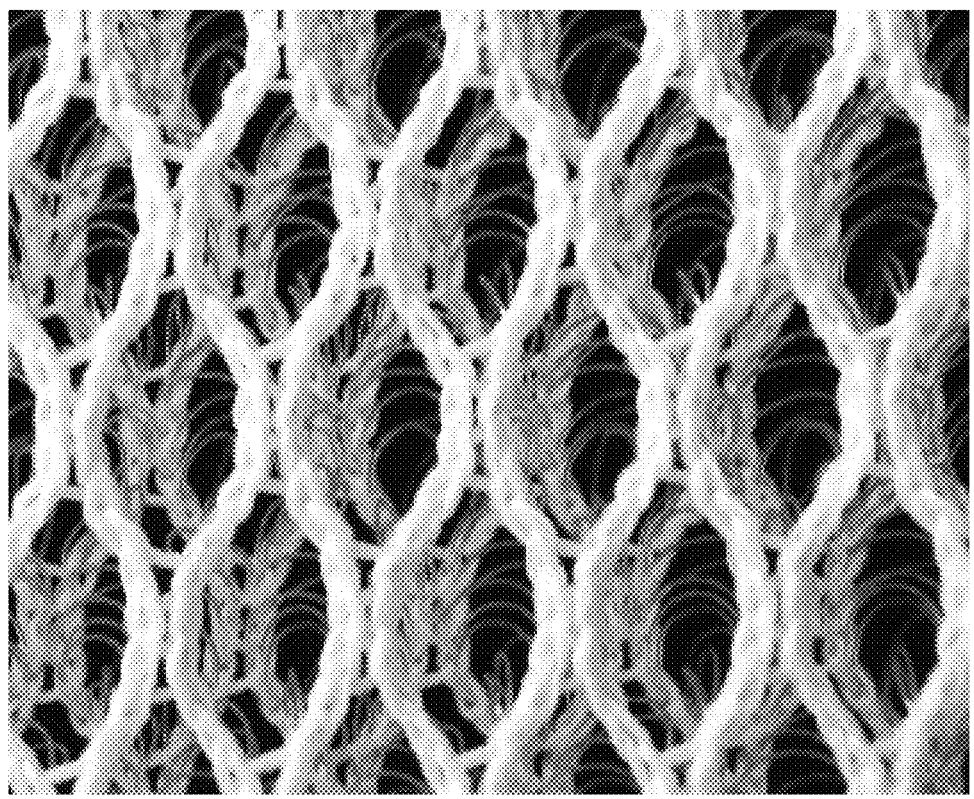
FIGS. 1a, and 1b show example warp knitted spacer fabrics that can be adopted for the insulating layer.
Figure 1B:
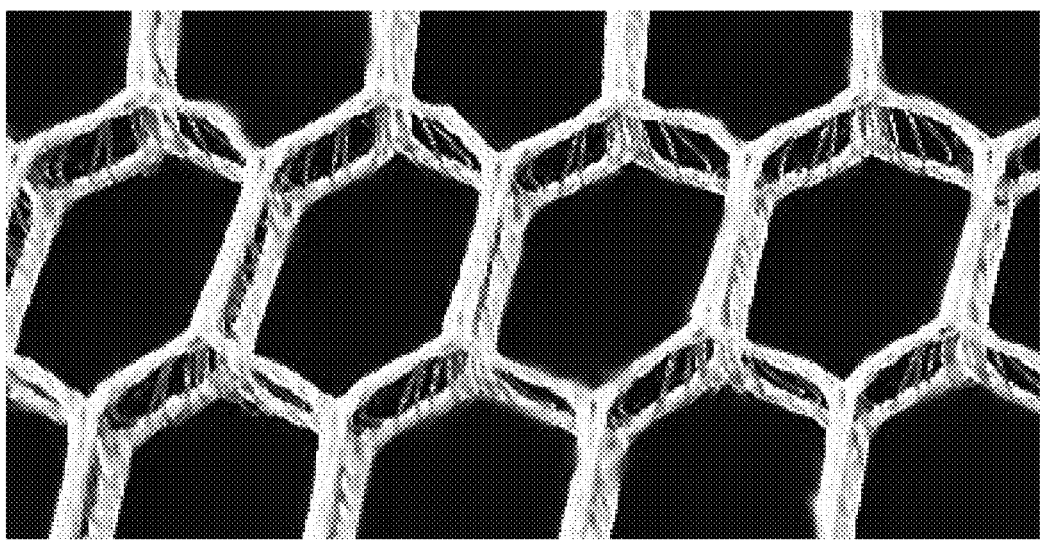

In a preferred embodiment, the textile spacer layer K is formed by a 3D warp knitted process, to build a spacer pattern similar to those shown in example knits in FIGS. 3a 1a and 13b. The patterns shown in FIGS. 3a 1a and 3b1b, or similar pattern, are optimised to give maximum infra red transparency through a high ratio of porosity to yarnairs gaps to yarn, while maintaining mechanical space stability, and minimising contact with the radiant barrier metal layer.

All said organic L1, L2, L3, layers above could also be replaced with an inorganic layer, such as a solgel, for example TiO2 with self cleaning functionality, or SiO2 providing protection from moisture while also having good infra red transparency.

In another alternative embodiment, the L1 coating could be functionalized to be hydrophobic and the L2 coating could be functionalized to be hydrophillic when forming the composite as to attract moisture away from the said metallic layer.

In a preferred embodiment, the textile spacer layer is hydrophilic as to attract moisture away from the said metallic layer.

In an alternative embodiment the textile spacer layer is hydrophobic as to repel moisture away from the composite reducing potential for moisture to build on the said metal layer thereby maintaining a low emissivity of the surface.

Patterns such as those examples in FIGS. 3a 1a and 3b 1b can be optionally chosen to help promote stretch of the composite.

In a preferred embodiment of the invention, the said substrate 203 is a non-porous, moisture vapor permeable and substantially liquid impermeable monolithic film. In an alternative preferred embodiment, the said substrate 203 is a microporous, moisture vapor permeable membrane.

In another preferred embodiment the said substrate 203 is a sheet comprising: a moisture vapor permeable sheet layer having first and second outer surfaces, the sheet layer comprising at least one of a nonwoven fabric, woven fabric, nonwoven fabric-film laminate, woven fabric-film laminate, moisture vapor permeable film and composites thereof, wherein the first outer surface of the moisture vapor permeable sheet layer is a porous sheet selected from the group consisting of microperforated films, woven fabrics and nonwoven fabrics.

In another embodiment of the present invention, at least one textile fabric such as a woven, non-woven, or knitted fabric is applied to the substrate after coating with said organic and metal layers, where the said textile is combined with the substrate by process of lamination. Lamination can occur by using an adhesive, or a melt film, or a melt fibre between surfaces or a stitching/needling process.

In a further embodiment of the present invention, the said organic or in-organic coatings comprise one or more functional components. Functionalities include hydrophilic coatings from monomers functonalised with groups including hydroxyl, carboxyl, sulphonic, amino, amido and ether. Hydrophobic coatings from monomers with hydrofluoric functional groups and/or monomers that create nanostructure on the textile surface. Antimicrobial coatings from a monomer with antimicrobial functional groups and/or encapsulated antimicrobial agents (including chlorinated aromatic compounds and naturally occurring antimicrobials). Fire retardant coatings from monomers with a brominated functional group. Self cleaning coatings from monomers and/or sol gels that have photo-catalytically active chemicals present (including zinc oxide, titanium dioxide, tungsten dioxide and other metal oxides). Ultraviolet protective coating from monomers and/or sol-gels that contain UV absorbing agents (including highly conjugated organic compounds and metal oxide compounds).

Moisture vapor permeable monolithic (non-porous) films are formed from a polymeric material that can be extruded as a thin, continuous, moisture vapor permeable, and substantially liquid impermeable film. The film layer can be extruded directly onto a first nonwoven, woven or knitted layer using conventional extrusion coating methods. Preferably, the monolithic film is no greater than about 3 mil (76 micrometers) thick, even no greater than about 1 mil (25 micrometers) thick, even no greater than about 0.75 mil (19 micrometers) thick, and even no greater than about 0.60 mil (15.2 micrometers) thick. In an extrusion coating process, the extruded layer and substrate layer are generally passed through a nip formed between two rolls (heated or unheated), generally before complete solidification of the film layer, in order to improve the bonding between the layers. A second nonwoven, woven or knitted layer can be introduced into the nip on the side of the film opposite the first substrate to form a moisture vapor permeable, substantially air impermeable laminate wherein the monolithic film is sandwiched between the two textile layers.

Polymeric materials suitable for forming moisture vapor permeable monolithic films include block polyether copolymers such as a block polyether ester copolymers, polyetheramide copolymers, polyurethane copolymers, poly (etherimide) ester copolymers, polyvinyl alcohols, or a combination thereof. Preferred copolyether ester block copolymers are segmented elastomers having soft polyether segments and hard polyester segments, as disclosed in Hagman, U.S. Pat. No. 4,739,012 that is hereby incorporated by reference. Suitable copolyether ester block copolymers include Hytrel® copolyether ester block copolymers sold by E. I. du Pont de Nemours and Company (Wilmington, Del.), and Arnitel® polyether-ester copolymers manufactured by DSM Engineering Plastics, (Heerlen, Netherlands). Suitable copolyether amide polymers are copolyamides available under the name Pebax® from Atochem Inc. of Glen Rock, N.J., USA. Pebax® is a registered trademark of Elf Atochem, S.A. of Paris, France. Suitable polyurethanes are thermoplastic urethanes available under the name Estane® from The B. F. Goodrich Company of Cleveland, Ohio, USA. Suitable copoly(etherimide) esters are described in Hoeschele et al., U.S. Pat. No. 4,868,062. The monolithic film layer can be comprised of multiple layers moisture vapor permeable film layers. Such a film may be co-extruded with layers comprised of one or more of the above-described breathable thermoplastic film materials.

According to the present invention, the metal and organic or inorganic coating layers are deposited on a non porous, moisture vapour permeable and substantially liquid impermeable substrate using methods that do not substantially reduce the moisture vapor permeability of the substrate. The metal and organic or in-organic coating layers are deposited via a vacuum vapour deposition method, this provides a coated composite substrate that has a moisture vapor permeability that is at least about 80%, even at least about 85%, and even at least about 90% of the moisture vapor permeability of the starting substrate material.

Vacuum vapor deposition methods known in the art are preferred for depositing the metal and organic or in-organic coatings. The thickness of the metal and organic or in-organic coatings are preferably controlled within ranges that provide a composite substrate having an emissivity no greater about 0.35.

The thickness and the composition of the outer organic or inorganic coating layer is selected such that, in addition to not substantially changing the moisture vapor permeability of the substrate layer, it does not significantly increase the emissivity of the metalized substrate. The outer organic or in-organic coating layer preferably has a thickness between about 0.2 µm and 2.5 µm, which corresponds to between about 0.15 g/m 2 to 1.9 g/m 2 of the coating material. In one embodiment, the outer coating layer has a thickness between about 0.2 µm and 1.0 µm (about 0.15 g/m 2 to 0.76 g/m 2), or between about 0.2 µm and 0.6 µm (about 0.15 g/m 2 to 0.46 g/m 2). The combined thickness of the intermediate and outer organic or in-organic layers is preferably no greater than about 2.5 µm, even no greater than about 2.0 µm, even no greater than about 1.5 µm. In one embodiment, the combined thickness of the intermediate and outer organic or in-organic coating layers is no greater than about 1.0 µm. For the structure Substrate/L1/M/L2, the intermediate coating layer preferably has a thickness between about 0.02 µm and 2 µm, corresponding to between about 0.015 g/m 2 and 1.5 g/m 2. In one embodiment, the intermediate coating layer has a thickness between about 0.02 µm and 1 µm (0.015 g/m 2 and 0.76 g/m 2), or between about 0.02 µm and 0.6 µm (0.015 g/m 2 and 0.46 g/m 2). When additional metal and organic or in-organic layers are deposited, the thickness of each organic or in-organic coating layer is adjusted such that the total combined thickness of all the organic or in-organic coating layers is no greater than about 2.5 µm, or no greater than about 1.0 µm. If the outer organic or in-organic coating layer is too thin, it may not protect the metal layer from oxidation, resulting in an increase in emissivity of the composite substrate. If the outer organic or inorganic coating layer is too thick, the emissivity of the composite substrate can increase, resulting in lower thermal barrier properties.

Suitable compositions for the organic coating layer(s) include polyacrylate polymers and oligomers. The coating material can be a cross-linked compound or composition. Precursor compounds suitable for preparing the organic coating layers include vacuum compatible monomers, oligomers or low MW polymers and combinations thereof. Vacuum compatible monomers, oligomers or low MW polymers should have high enough vapor pressure to evaporate rapidly in the evaporator without undergoing thermal degradation or polymerization, and at the same time should not have a vapor pressure so high as to overwhelm the vacuum system. The ease of evaporation depends on the molecular weight and the intermolecular forces between the monomers, oligomers or polymers. Typically, vacuum compatible monomers, oligomers and low MW polymers useful in this invention can have weight average molecular weights up to approximately 1200. Vacuum compatible monomers used in this invention are preferably radiation polymerizable, either alone or with the aid of a photoinitiator, and include acrylate monomers functionalized with hydroxyl, ether, carboxylic acid, sulfonic acid, ester, amine and other functionalities. The coating material may be a hydrophobic compound or composition. The coating material may be a crosslinkable, hydrophobic and oleophobic fluorinated acrylate polymer or oligomer, according to one preferred embodiment of the invention. Vacuum compatible oligomers or low molecular weight polymers include diacrylates, triacrylates and higher molecular weight acrylates functionalized as described above, aliphatic, alicyclic or aromatic oligomers or polymers and fluorinated acrylate oligomers or polymers. Fluorinated acrylates, which exhibit very low intermolecular interactions, useful in this invention can have weight average molecular weights up to approximately 6000. Preferred acrylates have at least one double bond, and preferably at least two double bonds within the molecule, to provide high-speed polymerization. Examples of acrylates that are useful in the coating of the present invention and average molecular weights of the acrylates are described in U.S. Pat. No. 6,083,628 and WO 98/18852.

Suitable compositions for the in-organic coating layers include metal oxide components including but not limited to Silicone dioxide, titanium dioxide, tungsten dioxide, zinc oxide. Inorganic coating layer(s) can be made by the sol-gel process of depositing a partially reacted metal alkoxide onto the substrate in the presence of water and an alcohol. The layer can also be produced from the deposition of a metal chloride solution. After application layers may be reduced in thickness by dry or moist heat treatment. The most effective method for deposition of metal alkoxide or metal chloride solutions onto the substrate is by flash evaporation and deposition in a vacuum environment.

Metals suitable for forming the metal layer(s) of the composites of the present invention include aluminum, gold, silver, zinc, tin, lead, copper, and their alloys. The metal alloys can include other metals, so long as the alloy composition provides a low emissivity composite substrate. Each metal layer has a thickness between about 15 nm and 200 nm, or between about 30 nm and 60 nm. In one embodiment, the metal layer comprises aluminum having a thickness between about 15 and 150 nm, or between about 30 and 60 nm. Methods for forming the metal layer are known in the art and include resistive evaporation, electron beam metal vapor deposition, or sputtering. If the metal layer is too thin, the desired thermal barrier properties will not be achieved. If the metal layer is too thick, it can crack and flake off and also reduce the moisture vapour permeability of the composite. Generally it is preferred to use the lowest metal thickness that will provide the desired thermal barrier properties. When the composite of the present invention is used in a garment the metal layer reflects infrared radiation providing a radiant thermal barrier that reduces energy loss and keeps the person wearing the garment warmer.

The thermal barrier properties of a material can be characterized by its emissivity. Emissivity is the ratio of the power per unit area radiated by a surface to that radiated by a black body at the same temperature. A black body therefore has an emissivity of one and a perfect reflector has an emissivity of zero. The lower the emissivity, the higher the thermal barrier properties. Each metal layer, intermediate organic coating and adjacent outer organic coating layer is preferably deposited sequentially under vacuum without exposure to air or oxygen so that there is no substantial oxidation of the metal layer. Polished aluminum has an emissivity between 0.039-0.057, silver between 0.020 and 0.032, and gold between 0.018 and 0.035. A layer of uncoated aluminum generally forms a thin aluminum oxide layer on its surface upon exposure to air and moisture. The thickness of the oxide film increases for a period of several hours with continued exposure to air, after which the oxide layer reaches a thickness that prevents or significantly hinders contact of oxygen with the metal layer, reducing further oxidation. Oxidized aluminum has an emissivity between about 0.20-0.31. By minimizing the degree of oxidation of the aluminum by depositing the outer organic coating layer prior to exposing the aluminum layer to the atmosphere, the emissivity of the composite substrate is significantly improved compared to an unprotected layer of aluminum. The outer organic coating layer also protects the metal from mechanical abrasion during roll handling, garment production and end-use.

As described in patent application US 2006/0040091 A1 (Bletsos) an apparatus suitable for vapor-deposition coating of a substrate layer with organic, in-organic and metal layers under vacuum is disclosed.

FIG. 1 is a schematic diagram of an apparatus 10 suitable for vapor-deposition coating of a substrate layer with organic, in-organic and metal layers under vacuum. In the description that follows, the term monomer is used to refer to vaporizable monomers, oligomers, and low molecular weight polymers. In the description that follows, the term sol-gel is used to refer to a solution of partially reacted metal alkoxide in the presence of water and an alcohol. The term inorganic layer includes layers of sol-gel composition.

A vacuum chamber 12 is connected to a vacuum pump 14, which evacuates the chamber to the desired pressure. Suitable pressures are between $2 \times 10^{-4}$ to $2 \times 10^{-5}$ Torr ($2.66 \times 10^{-5}$ to $2.66 \times 10^{-6}$ kPa). Moisture vapor permeable substrate 20 is fed from unwind roll 18 onto a cooled rotating drum 16, which rotates in the direction shown by arrow "A", via guide roll 24. The surface speed of drum 16 is generally in the range of 1 to 1000 cm/second. The substrate passes through several deposition stations after which it is picked off of the surface of the rotating drum by guide roller 26 and taken up by wind-up roll 22 as a coated composite substrate. Drum 16 is cooled to a temperature specific to the particular monomer or sol-gel being used to form the organic or in-organic coating, and can be cooled down to −20° C. to facilitate condensation of the monomer or sol-gel. After unwinding from roll 18, the substrate layer passes through optional plasma treatment unit 36, where the surface of the substrate is exposed to a plasma to remove adsorbed oxygen, moisture, and any low molecular weight species on the surface of the substrate prior to forming the metal or monomer coating thereon. The surface energy of the substrate is generally modified to improve wetting of the surface by the coating layers. The plasma source may be low frequency RF, high frequency RF, DC, or AC. Suitable plasma treatment methods are described in U.S. Pat. No. 6,066,826, WO 99/58757 and WO 99/59185.

An intermediate organic or in-organic layer is formed on the substrate layer prior to depositing the metal layer. In one embodiment, organic monomer or sol-gel is deposited on the moisture vapor permeable substrate layer by monomer evaporator 28, which is supplied with liquid monomer or sol-gel solution from a reservoir 40 through an ultrasonic atomizer 42, where, with the aid of heaters (not shown), the monomer or sol-gel liquid is instantly vaporized, i.e., flash vaporized, so as to minimize the opportunity for polymerization or thermal degradation prior to being deposited on the substrate layer. The monomer, oligomer, sol-gel solution or low molecular weight polymer liquid or slurry is preferably degassed prior to injecting it as a vapor into the vacuum chamber, as described in U.S. Pat. No. 5,547,508, which is hereby incorporated by reference. The specific aspects of the flash evaporation and monomer deposition process are described in detail in U.S. Pat. Nos. 4,842,893; 4,954,371; and 5,032,461, all of which are incorporated herein by reference.

The flash-vaporized monomer or sol-gel solution condenses on the surface of the substrate and forms a liquid monomer or sol-gel film layer. The monomer or sol-gel coating layer so that the composite substrate has a moisture vapor permeability of at least about 80% of the starting substrate layer. The condensed liquid monomer or sol-gel is solidified within a matter of milliseconds after condensation onto the substrate using a radiation curing means 30. Suitable radiation curing means include electron beam and ultraviolet radiation sources which cure the monomer or sol-gel film layer by causing polymerization or cross-linking of the condensed layer. If an electron beam gun is used, the energy of the electrons should be sufficient to polymerize the coating in its entire thickness as described in U.S. Pat. No. 6,083,628, which is incorporated herein by reference. The polymerization or curing of monomer and oligomer layers is also described in U.S. Pat. Nos. 4,842,893, 4,954,371 and 5,032,461. Alternately, an oligomer or low molecular weight polymer can solidify simultaneously with cooling. For oligomers or low MW polymers that are solid at room temperature, curing may not be required as described in U.S. Pat. No. 6,270,841 that is incorporated herein by reference. Alternatively a sol-gel solution can be cured by the addition of heat to the coating film.

After depositing the intermediate organic or inorganic layer, the coated substrate layer then passes to metallization system 32, where the metal layer is deposited on the solidified and optionally cured organic or inorganic layer. When a resistive metal evaporation system is used, the metallization system is continually provided with a source of metal from wire feed 44.

Following the metallization step, the outer organic or inorganic coating layer is deposited in a similar process as described above for the intermediate polymer layer using evaporator 128, monomer reservoir 140, ultrasonic atomizer 142, and radiation curing means 130. The composition of the outer organic or inorganic coating layer can be the same or different than the intermediate organic or inorganic coating layer. Optionally, a metal, organic-coated or in-organic coated side of the substrate layer can be plasma treated prior to depositing an additional organic, inorganic or metal coating layer thereon.

The thickness of the coating is controlled by the line speed and vapor flux of the flash evaporator used in the vapor deposition process. As the coating thickness increases, the energy of the electron beam must be adjusted in order for the electrons to penetrate through the coating and achieve effective polymerization. For example, an electron beam at 10 kV and 120 mA can effectively polymerize acrylate coatings up to 2 μm thick.

If more than one metal layer and/or more than two organic or inorganic layers are desired, additional flash evaporation apparatuses and metallization stations can be added inside the vacuum chamber. Alternately, a substrate layer can be coated in a first pass in the apparatus shown in FIG. 1, followed by removing the coated substrate and running it in a second pass through the apparatus. Alternately, a separate apparatus can be used for the metallization and organic or inorganic coating steps.

Coatings can be applied on the reverse side of the composite through use of a second rotating drum 16 that can be added within vacuum chamber 12, with additional plasma treatment units 36, monomer evaporators 28, 128, radiation curing means 30, 130 and metallization system 32, which can be operated independently as desired. Such a dual-drum coating system is illustrated in FIG. 1 of WO 98/18852, which is incorporated herein by reference.

It is preferred that an organic or in-organic coating is deposited on a metal layer prior to removing the coated substrate from the vacuum chamber to prevent significant oxidation of the metal layer. It is most preferred to deposit the organic or in-organic coating layer(s) and metal layer(s) in a single pass to minimize the processing cost.

Coatings can also be applied to the fabric before or after the vacuum metallization process by a textile coating method including rotary screen printing, block screen printing, transfer printing, jet printing, spraying, sculptured roller or other appropriate method. This will apply a thicker coating than that seen with vacuum deposition and may be preferred to provide higher levels of separation between the metallised layer and other elements of the insulation system, body or outside environment. This coating can be preceded by vacuum or atmospheric plasma treatment of the substrate to increase adhesion of the coating to the substrate.

The separation layer may also be applied to the fabric before or after the vacuum metallization process by lamination of a textile fabric to the metallized surface of the substrate. The fabric should be selected to provide high levels of IR transmission while retaining good stretch and drape. This lamination can be preceded by vacuum or atmospheric plasma treatment of the substrate to increase adhesion of the coating to the substrate.

In one embodiment, said metal may be produced by means of coating the substrate a thin metallic film by means of sputtering, rotary screen printing, block screen printing, transfer printing, jet printing, spraying, sculptured roller or other methods and adhering said metal film onto the said substrate. In alternative embodiment, said thin metallic film is applied onto a release paper or other material and then adhered onto said substrate.

The metalized composite substrates of the present invention are especially suitable for use in apparel or outdoor equipment such as tents or sleeping bags. The highly reflective metalized surface of the composite substrate provides a low emissivity surface that enhances the performance of the apparel and reduces heat loss from the body by reflecting body heat back in the system. Additional benefits include shielding the body from excessive heat during the summer months.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Although the present invention has been described with particular reference to certain preferred embodiments thereof, variations and modifications of the present invention can be effected within the spirit and scope of the following claims.

What is claimed is:

1. An infra-red reflective composite, comprising:
   a first moisture vapour permeable substrate having a bottom surface;
   a first metal layer disposed on the bottom surface of the first moisture vapour permeable substrate;
   a second moisture vapour permeable substrate having a top surface;
   a second metal layer disposed on the top surface of the second moisture vapour permeable substrate;
   an insulating textile layer disposed between the first metal layer and the second metal layer such that a top surface of the insulating textile layer is adjacent to the first metal layer and a bottom surface of the insulating textile layer is adjacent to the second metal layer, wherein the insulating textile layer covers substantially all of the first metal layer and the second metal layer; and
   wherein said insulating textile layer has a substantially lower thermal conductivity than the first metal layer, and has a structure which comprises gaps at the top surface and bottom surface of the insulation textile layer which exposes a portion of the first metal layer for infra red reflection while also providing mechanical separation of the first metal layer from the second metal layer, and wherein the insulating textile layer comprises a non-woven structure formed with fibers.

2. The composite according to claim 1, wherein said non-woven fibers are selected from the group consisting of a synthetic fiber, an organic fiber, and a combination of synthetic and organic fibers.

3. The composite according to claim 1, wherein said textile layer is adjacent to said metal layer.

4. The composite according to claim 1, wherein said insulating textile layer comprises at least one functional layer to provide at least one functional property to said insulating textile layer, and the functional layer of the insulating textile layer is disposed between the first metal layer and the textile layer.

5. The composite according to claim 4, wherein the thickness of the functional coating is between 0.2 µm to 2.5 µm.

6. The composite according to claim 1, further comprising a coating layer applied to a bottom surface of the first metal layer such that the coating layer is disposed between the first metal layer and the insulating textile layer.

7. The composite according to claim 6, wherein said coating layer applied to the bottom surface of the first metal layer comprises an organic layer on the first metal layer.

8. The composite according to claim 7, wherein the coating layer comprises a transition metal oxide selected from the group consisting of silicon dioxide, titanium dioxide, tungsten dioxide and zinc oxide.

9. The composite according to claim 1, wherein the first moisture vapour permeable substrate comprises at least one material selected from the group consisting of a nonwoven fabric, woven fabric, nonwoven fabric-film laminate, woven fabric-film laminate, and microperforated film.

10. The composite according to claim 1, wherein the first metal layer has a predetermined emissivity and comprises a material selected from the group consisting of Al, Cu, Au, Zn, Mg, Ti, Ag, Stainless steel, AgGe, CuZn, CuSn, CuAg, or CuAgSn.

11. The composite according to claim 1, wherein the first metal layer is comprised of a metal or metal alloy layer selected so as to provide a predetermined level emissivity.

12. The composite according to claim 1, wherein the metal layer comprises a silver precipitate for antibacterial properties.

13. The composite according to claim 1, wherein the first metal layer has a thickness between approximately 10 nm and approximately 200 nm.

14. An article of clothing comprising an infra-red reflective composite that includes a first moisture vapour permeable substrate having a bottom surface;
 a first metal layer disposed on the bottom surface of the first moisture vapour permeable substrate;
 a second moisture vapour permeable substrate having a top surface;
 a second metal layer disposed on the top surface of the second moisture vapour permeable substrate;
 an insulating textile layer disposed between the first metal layer and the second metal layer such that a top surface of the insulating textile layer is adjacent to the first metal layer and a bottom surface of the insulating textile layer is adjacent to the second metal layer; and
 wherein said insulating textile layer has a substantially lower thermal conductivity than the first metal layer, and has a structure which comprises gaps at the top surface and bottom surface of the insulation textile layer which exposes a portion of the first metal layer for infra red reflection while also providing mechanical separation of the first metal layer from the second metal layer, and wherein the insulating textile layer comprises a non-woven structure formed with fibers.

15. The article of clothing according to claim 14, wherein at least one of the first moisture vapour permeable substrate and the first metal layer further comprises a functional coating, such that the functional coating is positioned between the first metal layer and the first moisture vapour permeable substrate.

16. The article of clothing according to claim 14, wherein an outer layer is applied to the first metal layer to improve mechanical abrasion and reduce oxidation of the first metal layer.

17. The article of clothing according to claim 16, wherein the thickness of the outer layer is between 0.2 μm to 2.5 μm.

* * * * *